(12) United States Patent
Shao et al.

(10) Patent No.: US 12,336,169 B2
(45) Date of Patent: Jun. 17, 2025

(54) SEMICONDUCTOR STRUCTURE AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Guangsu Shao, Hefei (CN); Weiping Bai, Hefei (CN); Deyuan Xiao, Hefei (CN); Yunsong Qiu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 442 days.

(21) Appl. No.: 17/664,236

(22) Filed: May 20, 2022

(65) Prior Publication Data
US 2023/0061921 A1 Mar. 2, 2023

Related U.S. Application Data

(63) Continuation of application No. PCT/CN2022/077900, filed on Feb. 25, 2022.

(30) Foreign Application Priority Data

Aug. 30, 2021 (CN) .......................... 202111007675.5

(51) Int. Cl.
H10B 12/00 (2023.01)
(52) U.S. Cl.
CPC ......... *H10B 12/482* (2023.02); *H10B 12/315* (2023.02)

(58) Field of Classification Search
CPC .. H10B 12/482; H10B 12/315; H10B 12/053; H10B 12/34; H01L 21/764; H01L 21/76264
See application file for complete search history.

(56) References Cited

U.S. PATENT DOCUMENTS 9,837,422 B2 12/2017 Kim et al.
10,276,659 B2 4/2019 Xie et al.
(Continued)

FOREIGN PATENT DOCUMENTS

CN 103165539 A 6/2013
CN 107039450 A 8/2017
(Continued)

OTHER PUBLICATIONS

European Search Report cited in EP22732384.7 mailed Jul. 20, 2023, 8 pages.
(Continued)

*Primary Examiner* — Tucker J Wright
*Assistant Examiner* — David W Ward
(74) *Attorney, Agent, or Firm* — Kilpatrick Townsend & Stockton LLP

(57) ABSTRACT

The present disclosure provides a semiconductor structure and a manufacturing method thereof, relates to the technical field of semiconductors. The manufacturing method of the semiconductor structure includes: providing a substrate, a plurality of spaced first trenches being formed in the substrate; forming a sacrificial layer in the first trenches and a first protective layer on the sacrificial layer, the sacrificial layer and the first protective layer filling up the first trenches, and the first protective layer in the first trenches being provided with etching holes penetrating through the first protective layer; removing the sacrificial layer with the etching holes to form air gaps; and carrying out a silicifi- (Continued)

cation reaction on the substrate between adjacent ones of the first trenches and close to bottoms of the first trenches to form bit lines (BLs) in the substrate, parts of side surfaces of the BLs being exposed in the air gaps. t,?

11 Claims, 19 Drawing Sheets

(56) References Cited

U.S. PATENT DOCUMENTS

| | | |
|---|---|---|
| 10,720,439 B2 | 7/2020 | Song |
| 10,734,273 B2 | 8/2020 | Suk et al. |
| 2013/0146958 A1* | 6/2013 | Kim ..................... H10B 12/488 257/E29.345 |
| 2014/0061745 A1* | 3/2014 | Myung ................ H10D 64/252 257/532 |
| 2015/0145013 A1 | 5/2015 | Won |
| 2016/0104798 A1* | 4/2016 | Kim ..................... H10B 12/482 257/329 |
| 2021/0104458 A1* | 4/2021 | Huang ................... H10B 12/05 |
| 2021/0335626 A1* | 10/2021 | Xue ..................... H01L 21/3083 |

FOREIGN PATENT DOCUMENTS

| | | |
|---|---|---|
| CN | 108735816 A | 11/2018 |
| CN | 110071174 A | 7/2019 |
| CN | 110957319 A | 4/2020 |
| EP | 0957515 A1 | 11/1999 |

OTHER PUBLICATIONS

TW Office Action cited in TW111125194, mailed Aug. 17, 2023, mailed 10 pages.
International Search Report cited in PCT/CN2022/077900 mailed Apr. 13, 2022, 9 pages.

* cited by examiner

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/077900, filed on Feb. 25, 2022, which claims the priority to Chinese Patent Application 202111007675.5, titled "SEMICONDUCTOR STRUCTURE AND MANUFACTURING METHOD THEREOF" and filed with China National Intellectual Property Administration (CNIPA) on Aug. 30, 2021. The entire contents of International Patent Application No. PCT/CN2022/077900 and Chinese Patent Application 202111007675.5 are incorporated herein by reference.

TECHNICAL FIELD

The present disclosure relates to the technical field of semiconductors, and in particular to a semiconductor structure and a manufacturing method thereof.

BACKGROUND

With the development of semiconductor technologies, there are a higher integration level of the semiconductor structure (such as the memory), a smaller spacing between devices in the semiconductor structure and a smaller spacing between adjacent conductive devices (such as bit lines (BLs)) in the semiconductor structure. A parasitic capacitance arising from adjacent conductive devices and the insulating material between the conductive devices is directly proportional to a dielectric constant of the insulating material, while inversely proportional to a spacing between the two conductive devices. While the spacing between the BLs is decreased, an increasingly larger parasitic capacitance is generated to cause a resistor capacitor (RC) delay of the semiconductor structure, to affect working efficiency of the semiconductor structure.

SUMMARY

According to a first aspect, an embodiment of the present disclosure provides a manufacturing method of a semiconductor structure, including:
  providing a substrate, a plurality of spaced first trenches being formed in the substrate, and the first trenches extending along a first direction;
  forming a sacrificial layer in the first trenches and a first protective layer on the sacrificial layer, the sacrificial layer and the first protective layer filling up the first trenches, and the first protective layer in the first trenches being provided with etching holes penetrating through the first protective layer;
  removing the sacrificial layer with the etching holes to form air gaps; and
  carrying out a silicification reaction on the substrate between adjacent ones of the first trenches and close to bottoms of the first trenches, so as to form, in the substrate, BLs extending along the first direction, parts of side surfaces of the BLs being exposed in the air gaps.

According to a second aspect, an embodiment of the present disclosure provides a semiconductor structure, including: a substrate, where a plurality of spaced BLs are formed in the substrate, the BLs extend along a first direction, first trenches are formed between adjacent two of the BLs, the BLs each are provided thereon with at least an active region, the active region includes a source region, a channel region and a drain region that are stacked sequentially, and one of the source region and the drain region is electrically connected to the BL; a protective layer in the first trenches, where air gaps are formed between the protective layer and bottoms of the first trenches, and parts of side surfaces of the BLs are exposed in the air gaps; a plurality of spaced first insulating layers on the protective layer, where the first insulating layers extend along a second direction, and the first insulating layers are located between adjacent two rows of the active regions in the second direction, and spaced apart from the active regions; gate structures between the first insulating layers and the active regions, where the gate structures extend along the second direction and surround the active regions, and the gate structures are opposite to at least parts of the channel regions; and a second insulating layer and a third insulating layer covering the gate structures.

DETAILED DESCRIPTION

An embodiment of the present disclosure provides a manufacturing method of a semiconductor structure. Air gaps are formed between BLs, and parts of side surfaces of the BLs are exposed in the air gaps. As the air has a dielectric constant of about 1, the dielectric constant of the structure between the BLs is reduced, thus reducing the parasitic capacitance of the semiconductor structure and improving the working efficiency of the semiconductor structure.

In order to make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely a part rather than all of the embodiments of the present disclosure. All other embodiments obtained by those of ordinary skill in the art based on the embodiments of the disclosure without creative efforts shall fall within the protection scope of the present disclosure.

Figure 1:
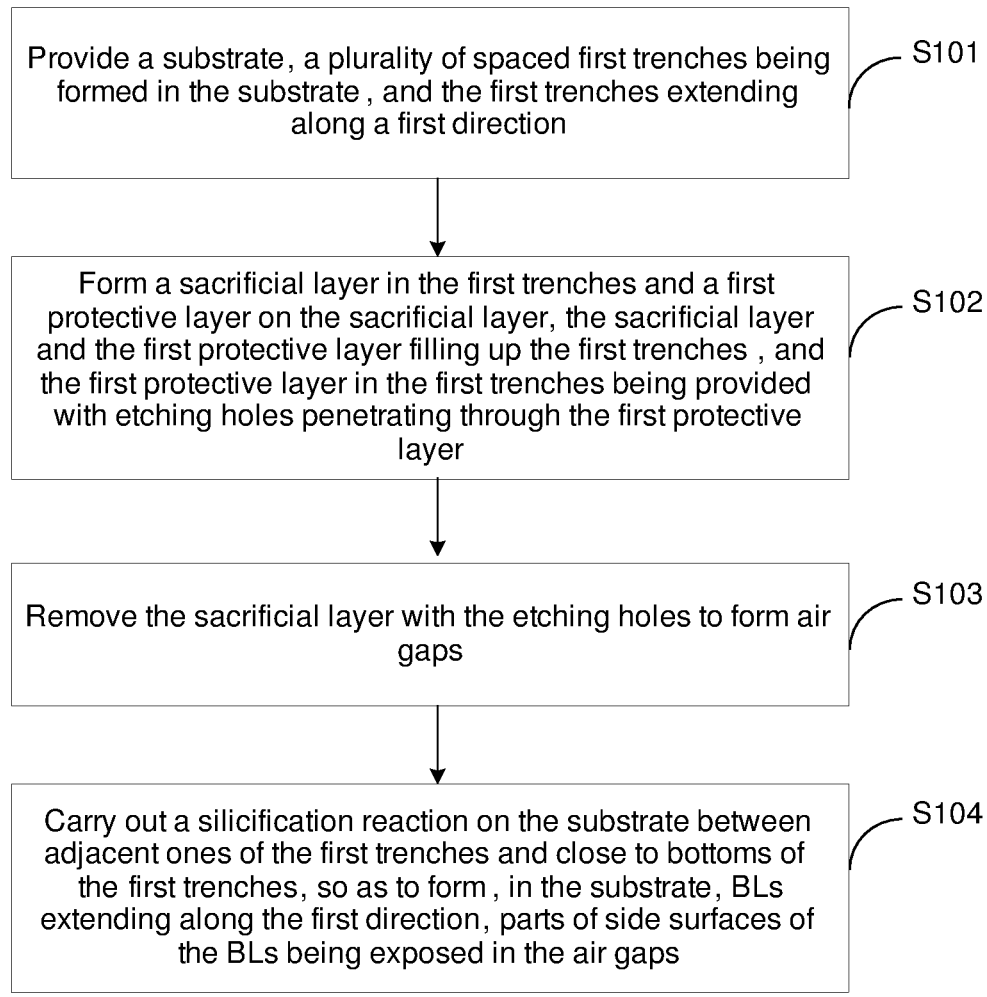
FIG. 1 is a flowchart of a manufacturing method of a semiconductor structure according to an embodiment of the present disclosure.

Referring FIG. 1, an embodiment of the present disclosure provides a manufacturing method of a semiconductor structure, including the following steps:

Step S101: Provide a substrate, a plurality of spaced first trenches being formed in the substrate, and the first trenches extending along a first direction.

Figure 2:
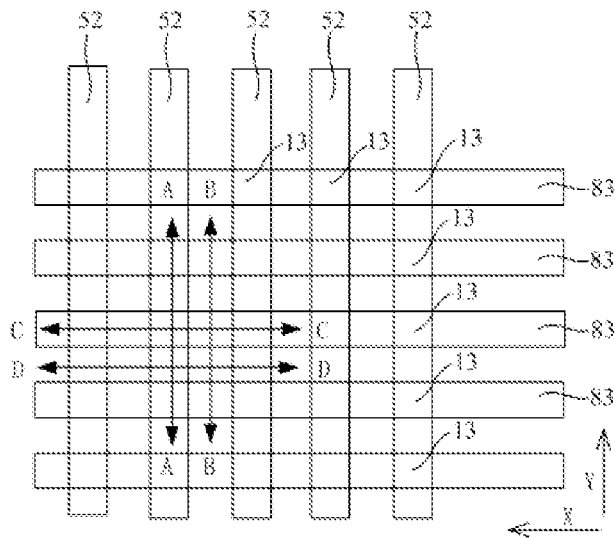
FIG. 2 is a top view of a semiconductor structure according to an embodiment of the present disclosure.
Figure 3:
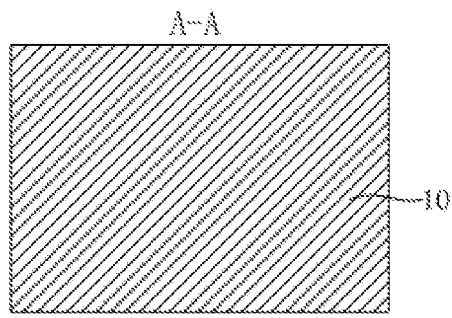
FIG. 3 to FIG. 6 are schematic sectional views of a substrate at A-A, B-B, C-C and D-D according to an embodiment of the present disclosure.
Figure 4:
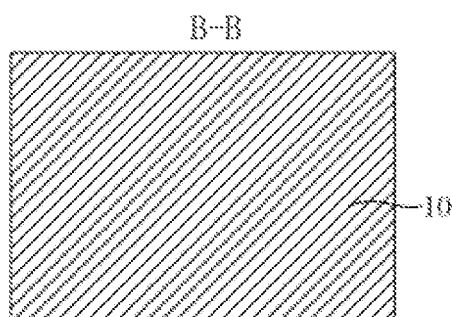
Figure 5:
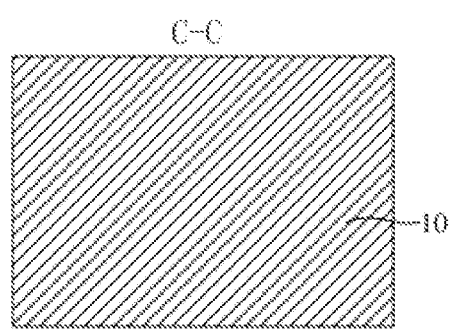
Figure 6:
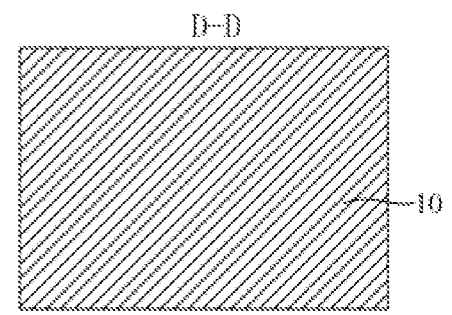
Figure 7:
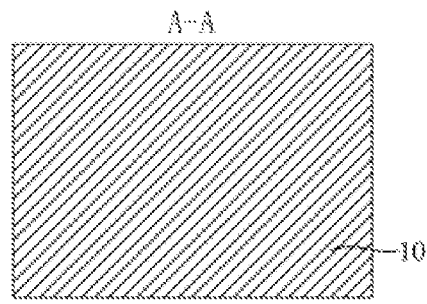
FIG. 7 to FIG. 10 are schematic sectional views at A-A, B-B, C-C and D-D after first trenches are formed according to an embodiment of the present disclosure.
Figure 8:
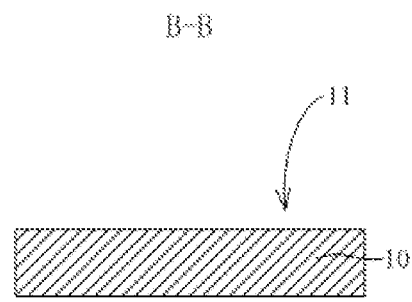
Figure 9:
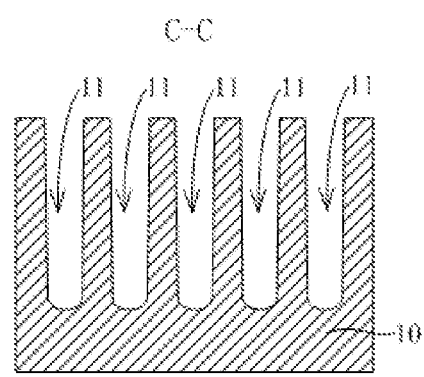
Figure 10:
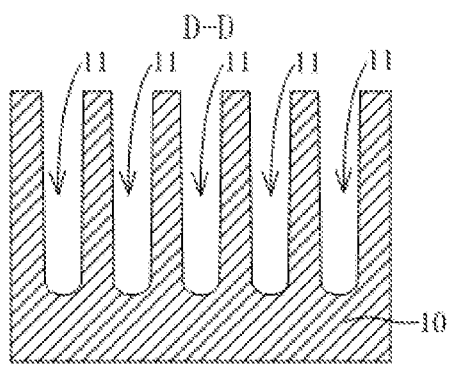
Figure 11:
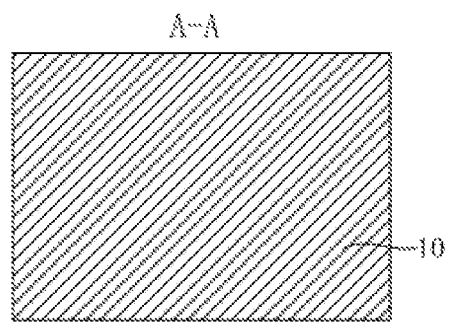
FIG. 11 to FIG. 14 are schematic sectional views at A-A, B-B, C-C and D-D after a first protective layer is formed according to an embodiment of the present disclosure.
Figure 12:
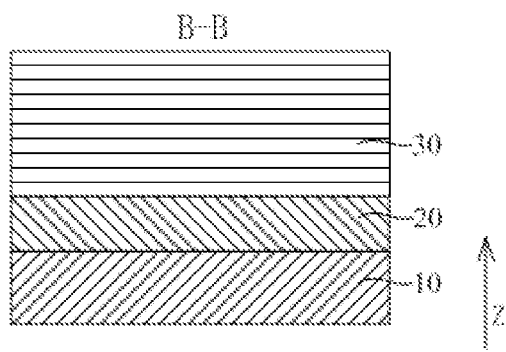
Figure 13:
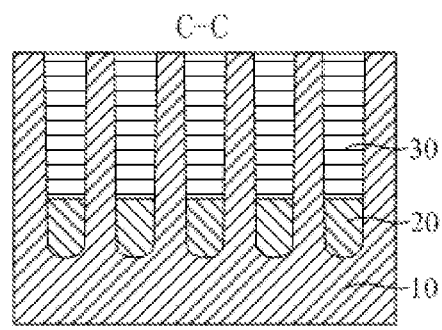
Figure 14:
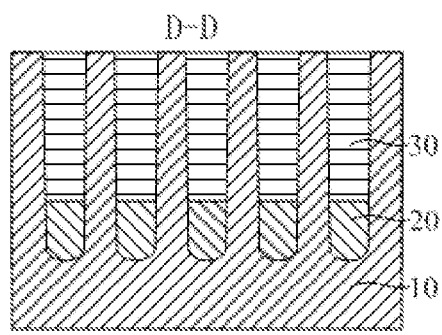
Figure 15:
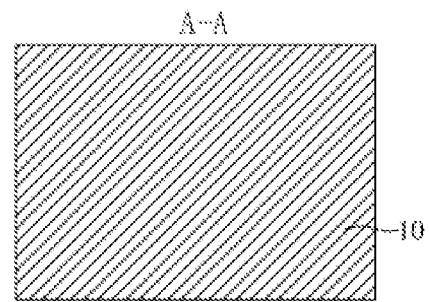
FIG. 15 to FIG. 18 are schematic sectional views at A-A, B-B, C-C and D-D after etching holes are formed according to an embodiment of the present disclosure.

FIG. 2 is a top view of a semiconductor structure according to an embodiment of the present disclosure. Referring to FIG. 2, word lines (WLs) 83 and BLs 52 are formed in the semiconductor structure. The BLs 52 extend along the first direction, while the WLs 83 extend along the second direction. There is an included angle between the first direction and the second direction. For example, the first direction may be perpendicular to the second direction. Specifically, as shown in FIG. 2, the BLs 52 extend along a vertical direction (Y direction), while the WLs 83 extend along a horizontal direction (X direction). Gate structures are formed in the WLs 83. The WLs 83 or the BLs 52 may be straight lines, and may also be fold lines.

FIG. 2 shows sections at different positions. Specifically, the section A-A is parallel to the extension direction of the BLs 52 and located on the BLs 52, and the section B-B is parallel to the extension direction of the BLs 52 and located between adjacent BLs 52. The section C-C is parallel to the extension direction of the WLs 83 and located on the WLs 83, and the section D-D is parallel to the extension direction of the WLs 83 and located between adjacent WLs 83.

Referring to FIG. 3 to FIG. 6, the substrate 10 may be a semiconductor substrate. The semiconductor substrate may include a silicon element. For example, the substrate may be a silicon substrate, a silicon-germanium substrate or a silicon on insulator (SOI) substrate. For convenience, detailed descriptions will be made by taking the silicon substrate as the substrate 10 for example in the embodiment of the present disclosure and the following embodiments.

Referring to FIGS. 7-10, a plurality of first trenches 11 are formed in the substrate 10. The first trenches 11 extend along the first direction and are spaced apart. Exemplarily, the substrate 10 is etched to form the first trenches 11 in the substrate 10. Specifically, the first trenches 11 are formed by self-aligned double patterning (SADP) or self-aligned quadruple patterning (SAQP) to increase the density of the first trenches 11.

Step S102: Form a sacrificial layer in the first trenches and a first protective layer on the sacrificial layer, the sacrificial layer and the first protective layer filling up the first trenches, and the first protective layer in the first trenches being provided with etching holes penetrating through the first protective layer.

Referring to FIG. 7 to FIG. 14, bottoms of the first trenches 11 are filled with the sacrificial layer 20, and remaining parts of the first trenches 11 are filled with the first protective layer 30. The sacrificial layer 20 and the first protective layer 30 are made of different materials. For example, the sacrificial layer 20 has a larger etch selectivity than the first protective layer 30, which makes the first protective layer 30 less etched in subsequent removal of the sacrificial layer 20. Exemplarily, the material of the first protective layer 30 may be silicon oxide, while the material of the sacrificial layer 20 may be silicon nitride.

Figure 19:
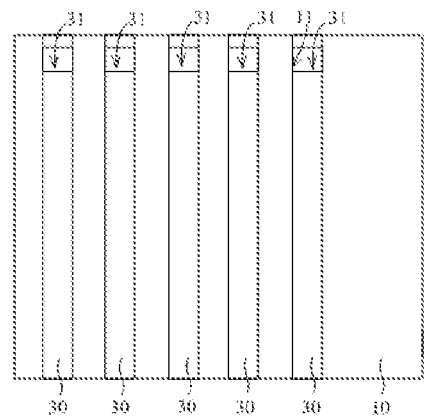
FIG. 19 is a top view after etching holes are formed according to an embodiment of the present disclosure.
Figure 20:
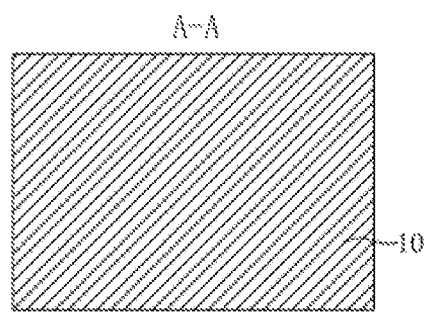
FIG. 20 to FIG. 23 are schematic sectional views at A-A, B-B, C-C and D-D after air gaps are formed according to an embodiment of the present disclosure.

Referring to FIG. 15 to FIG. 19, the first protective layer 30 spaced by the first trenches 11 is provided with etching holes 31. The etching holes 31 penetrate through the first protective layer 30. The etching holes 31 expose the sacrificial layer 20. Based on a plane parallel to the substrate 10, sections of the etching holes 31 each may be of a circular shape, an elliptical shape, a square shape, a rectangular shape or other polygonal shapes. As shown in FIG. 19, parts of walls of the etching holes 31 may further be sidewalls of the first trenches 11. The etching holes 31 may be formed in edges of the first trenches 11 and away from regions for forming the WLs 83. There may be one or more etching holes 31 in each first trench 11. For example, two ends of the first trench 11 are respectively provided with one etching hole 31.

Figure 16:
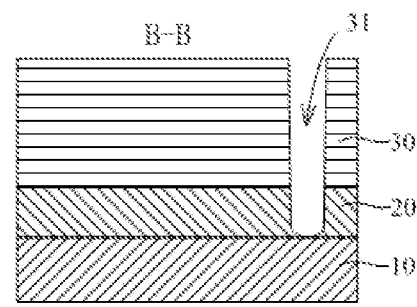
Figure 17:
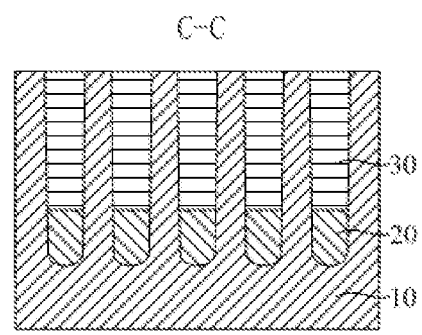
Figure 18:
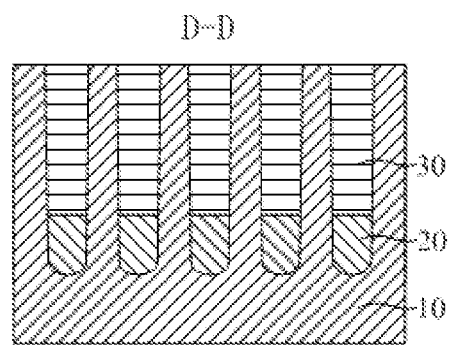

In order to increase a surface area of the sacrificial layer 20 exposed in the etching holes 31 and remove the sacrificial layer subsequently, the etching holes 31 may extend to the sacrificial layer 20, as shown in FIG. 16. Exemplarily, bottoms of the etching holes 31 are located in the sacrificial layer 20, or the etching holes 31 penetrate through the sacrificial layer 20.

In a possible example, referring to FIG. 7 to FIG. 18, the step of forming a sacrificial layer 20 in the first trenches 11 and a first protective layer 30 on the sacrificial layer 20, the sacrificial layer 20 and the first protective layer 30 filling up the first trenches 11, and the first protective layer 30 in the first trenches 11 being provided with etching holes 31 penetrating through the first protective layer 30 may include:

Step S1021: Deposit the sacrificial layer in the first trenches, the sacrificial layer filling the bottoms of the first trenches.

Referring to FIG. 7 to FIG. 14, the sacrificial layer 20 is formed in the first trenches 11 by chemical vapor deposition (CVD), physical vapor deposition (PVD) or atomic layer deposition (ALD). The thickness direction of the sacrificial layer 20 and the depth direction of the first trench 11 are the same and both are a direction perpendicular to the substrate 10 (Z direction shown in FIG. 12).

Step S1022: Deposit the first protective layer on the sacrificial layer, the first protective layer leveling off the first trenches.

Referring to FIG. 11 to FIG. 14, the first protective layer 30 is deposited on the sacrificial layer 20 and the substrate 10. The first protective layer 30 fills the first trenches 11 and covers a top surface of the substrate 10. As shown in FIG. 11 to FIG. 14, the top surface of the substrate 10 refers to an upper surface of the substrate 10. The first protective layer 30 on the top surface of the substrate 10 is removed to expose the substrate 10. Exemplarily, the first protective layer 30 on the top surface of the substrate 10 is removed by chemical mechanical polishing (CMP). After the first protective layer 30 is removed, the top surface of the substrate 10 is exposed.

Step S1023: Etch the first protective layer at edges of the first trenches to form the etching holes.

As shown in FIG. 15 to FIG. 18, in some possible examples, a mask plate is deposited on the substrate 10 and the first protective layer 30. With the mask plate as a mask, the first protective layer 30 is removed by dry etching or wet etching to form the etching holes 31 shown in FIG. 16. The mask plate is then removed.

Step S103: Remove the sacrificial layer with the etching holes to form air gaps.

Figure 21:
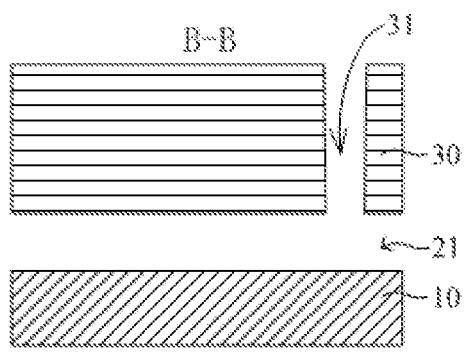
Figure 22:
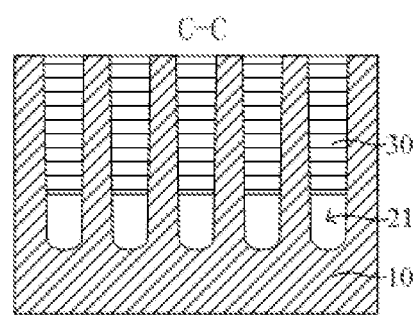
Figure 23:
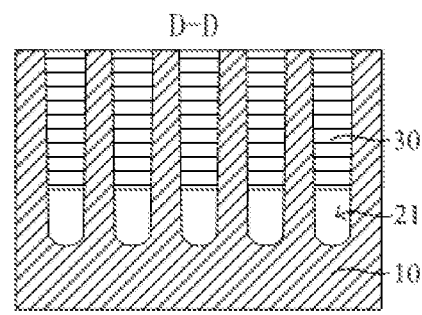
Figure 24:
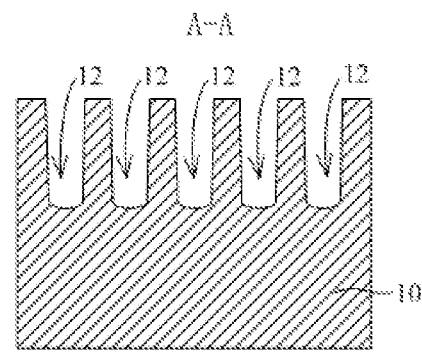
FIG. 24 to FIG. 27 are schematic sectional views at A-A, B-B, C-C and D-D after second trenches are formed according to an embodiment of the present disclosure.
Figure 25:
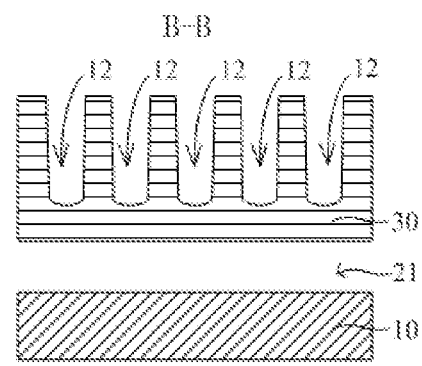
Figure 26:
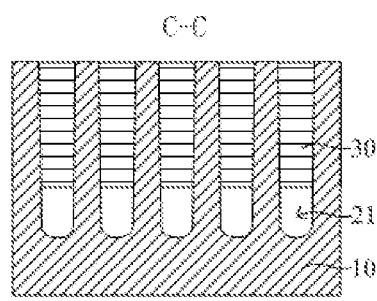
Figure 27:
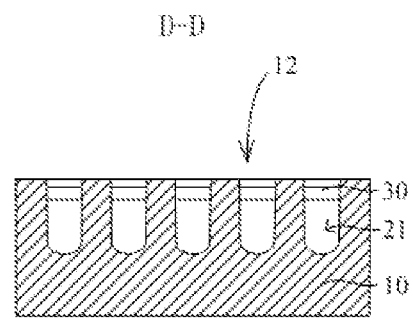
Figure 28:
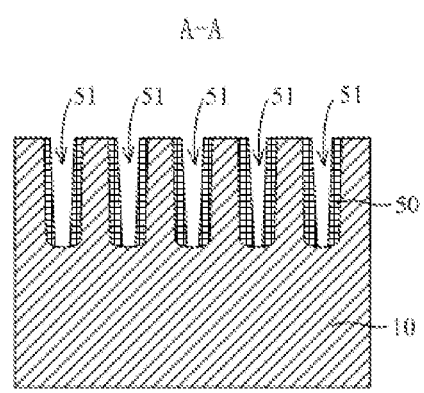
FIG. 28 to FIG. 31 are schematic sectional views at A-A, B-B, C-C and D-D after a second protective layer is formed according to an embodiment of the present disclosure.
Figure 29:
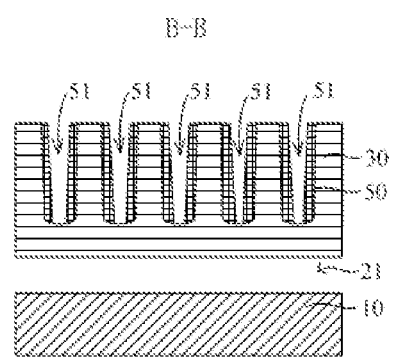
Figure 30:
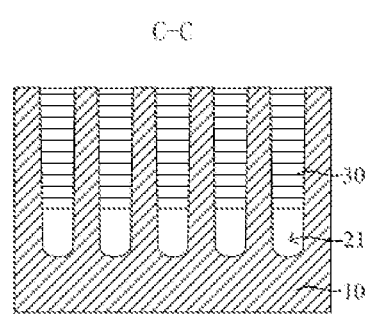
Figure 31:
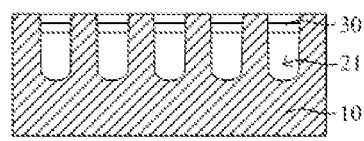
Figure 32:
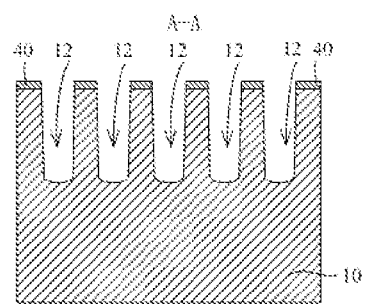
FIG. 32 to FIG. 35 are schematic sectional views at A-A, B-B, C-C and D-D after a third protective layer is formed according to an embodiment of the present disclosure.
Figure 33:
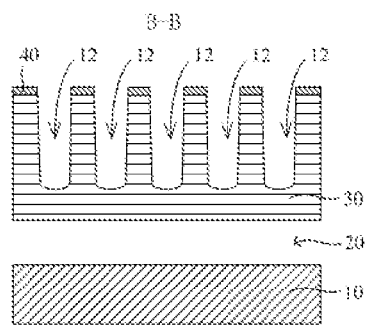
Figure 34:
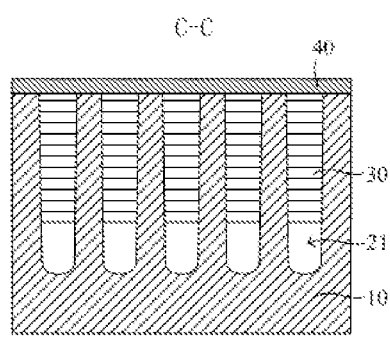
Figure 35:
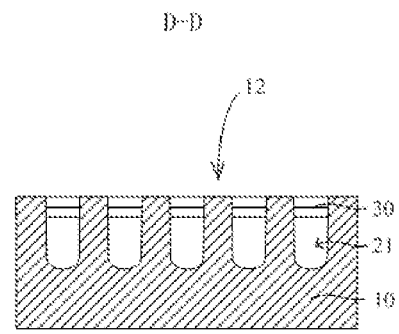

Referring to FIG. 20 to FIG. 23, the sacrificial layer 20 is removed with an etching gas or an etching solution in the etching holes 31. After the sacrificial layer 20 in the first trenches is removed, air gaps 21 are formed in the first trenches. As shown in FIG. 21, the air gap 21 is located under the etching hole 31, and communicates with the etching hole 31.

Step S104: Carry out a silicification reaction on the substrate between adjacent ones of the first trenches and close to bottoms of the first trenches, thereby forming, in the substrate, BLs extending along the first direction, parts of side surfaces of the BLs being exposed in the air gaps.

Referring to FIG. 24 to FIG. 43, the BLs 52 are formed in the substrate 10. The BLs 52 extend along the first direction. The BLs 52 are located between adjacent first trenches, and close to the bottoms of the first trenches. The BLs 52 are as wide as the substrate 10 between adjacent first trenches, such that parts of side surfaces of the BLs 52 are exposed in the air gaps 21. As shown in FIG. 40 to FIG. 43, lower parts of the side surfaces of the BLs 52 are exposed in the air gaps 21, while upper parts of the side surfaces of the BLs 52 contact the first protective layer 30.

The BLs 52 may be formed by the silicification reaction. A material of the BLs 52 includes metal silicide, such as cobalt silicide, tungsten silicide, titanium silicide, platinum silicide or nickel silicide, to reduce resistances of the BLs 52. Exemplarily, as shown in FIG. 24 to FIG. 43, the step of carrying out a silicification reaction on the substrate 10 between adjacent ones of the first trenches 11 and close to bottoms of the first trenches 11, thereby forming, in the substrate 10, BLs 52 extending along the first direction, parts of side surfaces of the BLs 52 being exposed in the air gaps 21 includes:

Step S1041: Etch the substrate and the first protective layer to form a plurality of spaced second trenches, the second trenches extending along a second direction and not communicating with the air gaps.

Referring to FIG. 24 to FIG. 27, the substrate 10 and the first protective layer 30 are etched to form a plurality of second trenches 12. The second trenches 12 are spaced apart and extend along the second direction. The second trenches 12 do not communicate with the air gaps 21, namely bottoms of the second trenches 12 are located in the substrate 10 and the first protective layer 30, without penetrating through the first protective layer 30. Therefore, the remaining first protective layer 30 seals tops of the air gaps 21, which prevents other materials from falling into the air gaps 21 in subsequent manufacture and reduces the parasitic capacitances through the air gaps 21.

Step S1042: Form a second protective layer on sidewalls of the second trenches, the second protective layer in the second trenches enclosing third trenches.

Referring to FIG. 24 to FIG. 31, a second protective layer 50 is formed on sidewalls of the second trenches 12. The second protective layer 50 covers the sidewalls of the second trenches 12. The second protective layer 50 in the second trenches 12 encloses third trenches 51. The third trenches 51 exposes parts of the bottoms of the second trenches 12. The first protective layer 30 and the second protective layer 50 may be made of a same material, such that the first protective layer 30 and the second protective layer 50 are formed into a whole.

In a possible embodiment, a second initial protective layer is deposited on the sidewalls and bottoms of the second trenches 12, the substrate 10 and the first protective layer 30, the second initial protective layer in the second trenches 12 enclosing the third trenches 51. The second initial protective layer is etched along the third trenches 51 to remove the second initial protective layer on the bottoms of the second trenches 12, the remaining second initial protective layer being formed into the second protective layer 50.

In another possible embodiment, referring to FIG. 32 to FIG. 35, a third protective layer 40 is further deposited on the substrate 10 and the first protective layer 30, namely the third protective layer 40 covers the top surface of the substrate 10. The third protective layer 40, the second protective layer 50 and the first protective layer 30 may be made of a same material to form a whole.

Referring to FIG. 32 to FIG. 39, a second initial protective layer is deposited on the sidewalls and bottoms of the second trenches 12 and on the third protective layer 40. The second initial protective layer on the third protective layer 40 and the second initial protective layer on the bottoms of the second trenches 12 are removed to expose the bottoms of the second trenches 12, the remaining second initial protective layer forming the second protective layer 50.

It is to be understood that when the second initial protective layer is etched along the third trenches 51 by anisotropic etching to remove the second initial protective layer on the bottoms of the second trenches 12, the second initial protective layer on the third protective layer 40 is etched inevitably. With the third protective layer 40, only the substrate 10 in the second trenches 12, rather than the top surface of the substrate 10, is exposed to ensure forming positions of the BLs 52.

Figure 36:
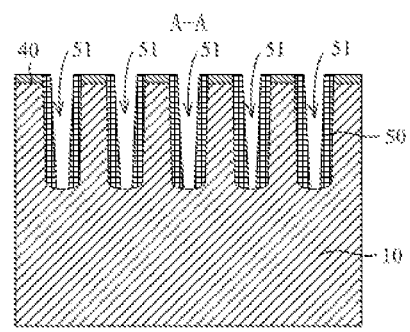
FIG. 36 to FIG. 39 are another schematic sectional views at A-A, B-B, C-C and D-D after a second protective layer is formed according to an embodiment of the present disclosure.
Figure 37:
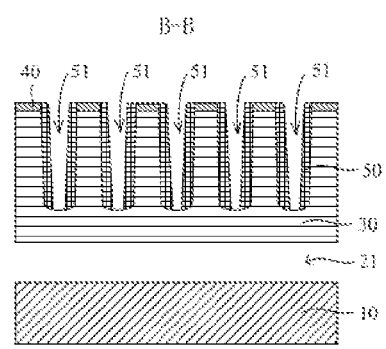
Figure 38:
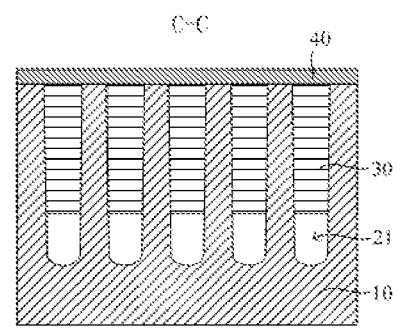
Figure 39:
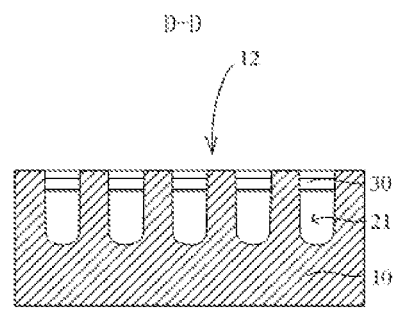
Figure 40:
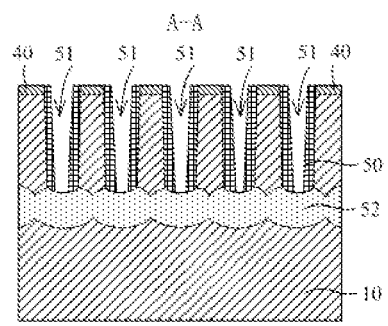
FIG. 40 to FIG. 43 are schematic sectional views at A-A, B-B, C-C and D-D after BLs are formed according to an embodiment of the present disclosure.
Figure 41:
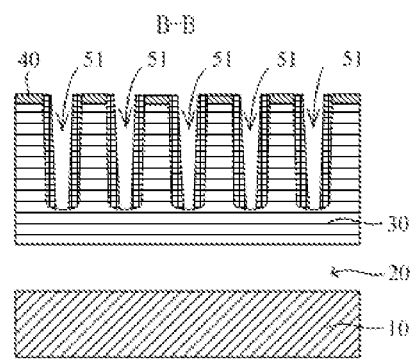
Figure 42:
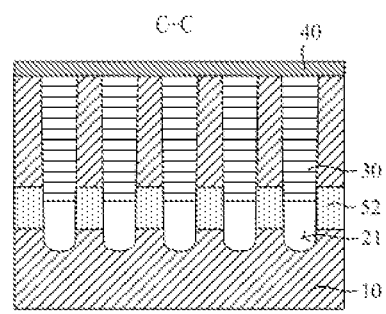
Figure 43:
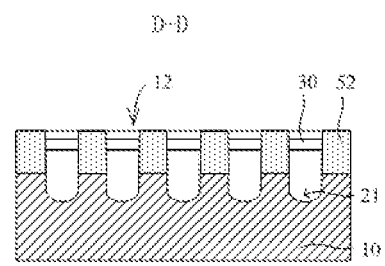
Figure 44:
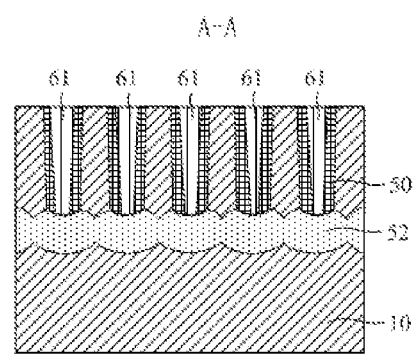
FIG. 44 to FIG. 47 are schematic sectional views at A-A, B-B, C-C and D-D after first insulating layers are formed according to an embodiment of the present disclosure.
Figure 45:
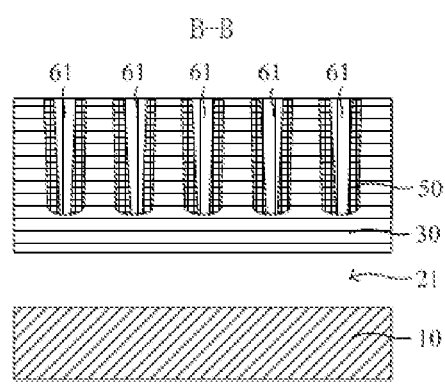
Figure 46:
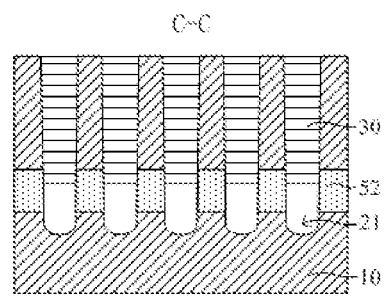
Figure 47:
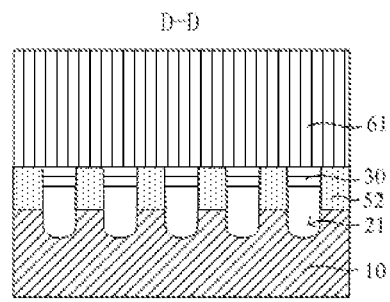
Figure 48:
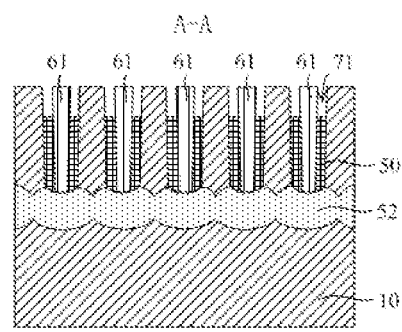
FIG. 48 to FIG. 51 are schematic sectional views at A-A, B-B, C-C and D-D after filling channels are formed according to an embodiment of the present disclosure.
Figure 49:
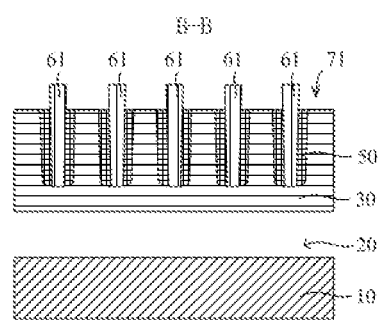
Figure 50:
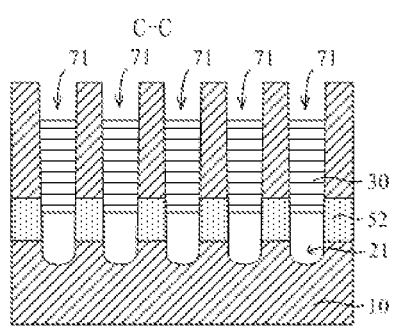
Figure 51:
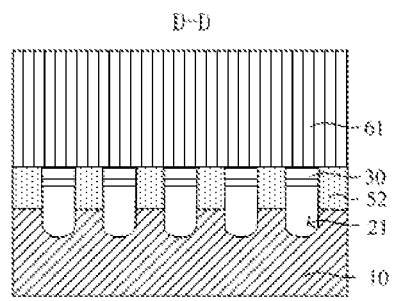
Figure 52:
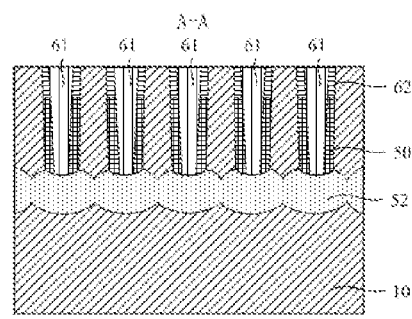
FIG. 52 to FIG. 55 are schematic sectional views at A-A, B-B, C-C and D-D after a second insulating layer is formed according to an embodiment of the present disclosure.
Figure 53:
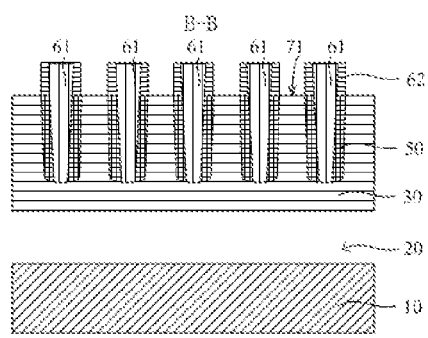
Figure 54:
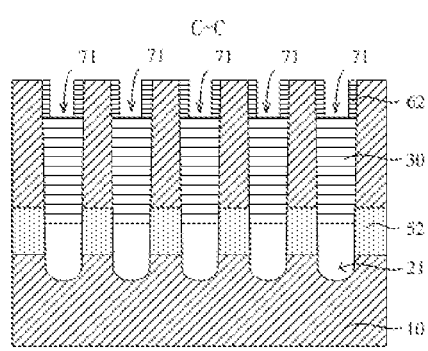
Figure 55:
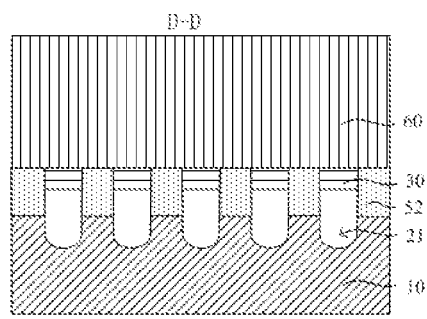
Figure 56:
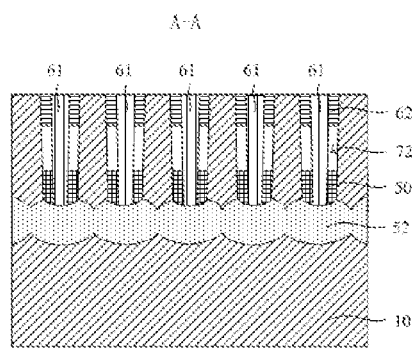
FIG. 56 to FIG. 59 are schematic sectional views at A-A, B-B, C-C and D-D after filling spaces are formed according to an embodiment of the present disclosure.
Figure 57:
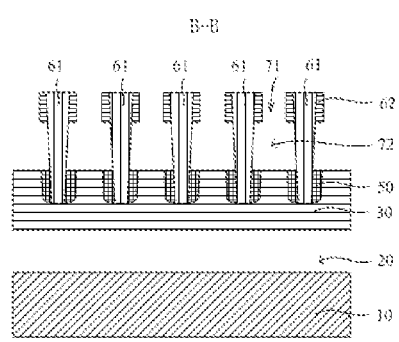
Figure 58:
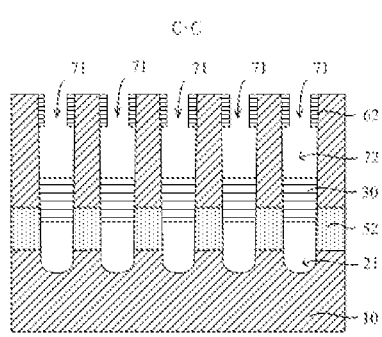
Figure 59:
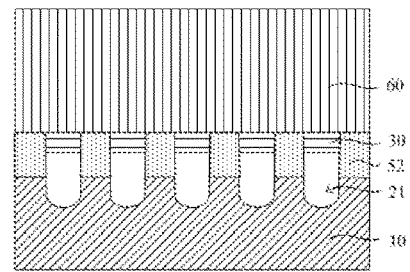
Figure 60:
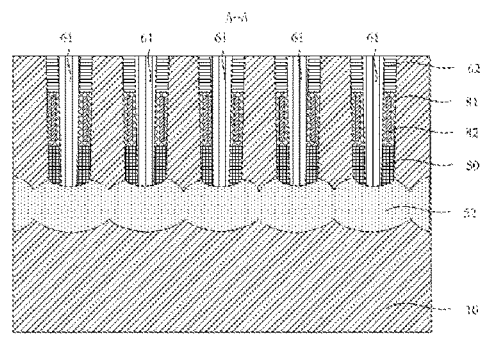
FIG. 60 to FIG. 63 are schematic sectional views at A-A, B-B, C-C and D-D after conductive layers are formed according to an embodiment of the present disclosure.
Figure 61:
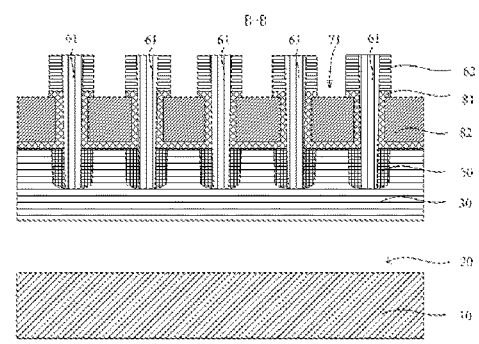
Figure 62:
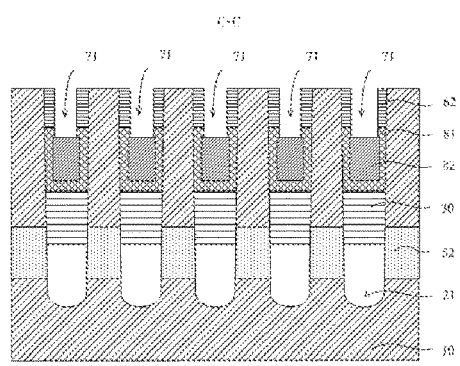
Figure 63:
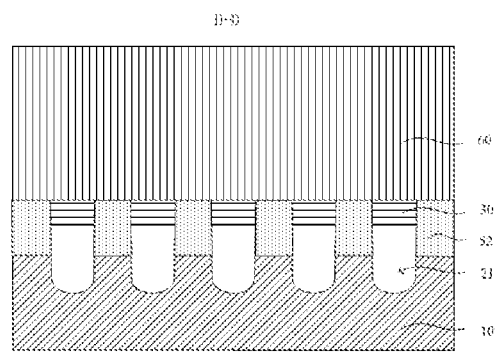
Figure 64:
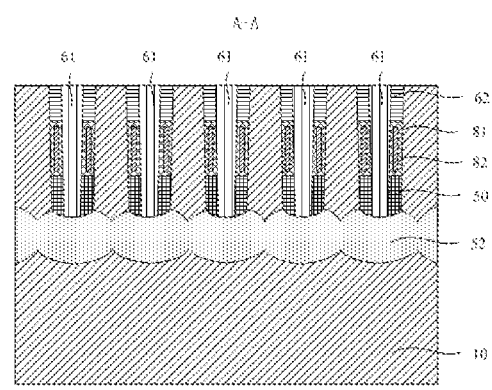
FIG. 64 to FIG. 67 are schematic sectional views at A-A, B-B, C-C and D-D after a third insulating layer is formed according to an embodiment of the present disclosure.
Figure 65:
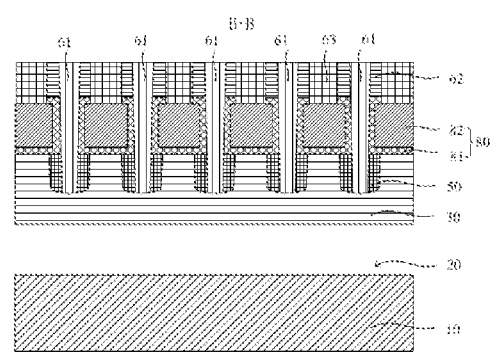

As shown in FIG. 36 to FIG. 37, a plurality of pillars are formed on an upper part of the substrate 10. The second protective layer 50 covers outer peripheral surfaces of the pillars. The third protective layer 40 covers top surfaces of the pillars. The substrate 10 on bottoms of the third trenches 51 is exposed. For convenience, the case where the third protective layer 40 is formed on the substrate 10 is used as an example for detailed descriptions in the embodiment of the present disclosure and the following embodiments.

It is to be noted that the step of depositing a third protective layer 40 on the substrate 10 and the first protective layer 30 may be executed before the step of etching the substrate 10 and the first protective layer 30 to form a plurality of spaced second trenches 12, the second trenches 12 extending along a second direction and not communicating with the air gaps 21 (Step S1041), namely the step is executed before Step S104. Specifically, the step may be executed after Step S1022, may also be executed after Step S1023, and may further be executed after Step S103.

Preferably, after the step of depositing the first protective layer 30 on the sacrificial layer 20, the first protective layer 30 leveling off the first trenches 11 (Step S1023), the third protective layer 40 is deposited on the substrate 10 and the first protective layer 30. The above arrangement facilitates the manufacture and reduces the manufacturing difficulty of the third protective layer 40, and can further prevent the third protective layer 40 from falling into the etching holes 31 or the air gaps 21 to improve the performance of the semiconductor structure.

Correspondingly, the step of etching the substrate 10 and the first protective layer 30 to form a plurality of spaced second trenches 12, the second trenches 12 extending along a second direction and not communicating with the air gaps 21 (Step S1041) includes: Etch the substrate 10, the first protective layer 30 and the third protective layer 40 to form the plurality of spaced second trenches 12, and remain the third protective layer 40 between adjacent ones of the second trenches 12.

Step S1043: Deposit metal on bottoms of the third trenches, and carry out the silicification reaction by annealing to form the BLs.

Referring to FIG. 40 to FIG. 43, the metal may be one of cobalt, titanium, tantalum, nickel and tungsten, and may also be refractory metal. The metal reacts with the substrate 10 to form metal silicide, and the substrate 10 between adjacent first trenches is silicided completely. The metal silicide is connected along the first direction to form the BLs 52. Parts of top surfaces of the BLs 52 are exposed in the third trenches 51, and parts of side surfaces of the BLs 52 are exposed in the air gaps 21.

The annealing includes rapid thermal annealing (RTA). The annealing temperature is matched with the material of the metal and the material of the substrate 10. For example, when the substrate 10 is made of silicon and the metal is the cobalt, the annealing temperature may be 400-800° C.

According to the manufacturing method of a semiconductor structure provided by the embodiment of the present disclosure, the sacrificial layer 20 is removed to form the air gaps 21 between the BLs 52 extending along the first direction, and parts of side surfaces of the BLs 52 are exposed in the air gaps 21. As the air has a dielectric constant of about 1, the dielectric constant of the structure between the BLs 52 is reduced, thus reducing the parasitic capacitance of the semiconductor structure and improving the working efficiency of the semiconductor structure.

It is to be noted that, before the step of forming a second protective layer 50 on sidewalls of the second trenches 12, the second protective layer 50 in the second trenches 12 enclosing third trenches 51, the manufacturing method of a semiconductor structure further includes: Form active regions 13 in the substrate 10 away from the bottoms of the first trenches 11, where the active regions 13 each include a source region, a drain region and a channel region; and the source region, the channel region and the drain region are arranged sequentially along a direction perpendicular to the bottoms of the first trenches 11.

Before the BLs 52 are formed, a plurality of spaced active regions are formed in the substrate 10. The active regions each include a source region, a drain region and a channel region. The channel region is located between the source region and the drain region. In the embodiment of the present disclosure, the source region, the channel region and the drain region are arranged vertically, namely arranged sequentially along the direction perpendicular to the bottoms of the first trenches 11 to form a vertical transistor. The source regions or the drain regions are close to the bottoms of the first trenches 11. The source regions or the drain regions close to the bottoms of the first trenches 11 are electrically connected to the subsequently formed BLs 52, namely the source regions or the drain regions are electrically connected to the BLs 52. In this way, under the same area of the substrate 10, the channel regions can be effectively lengthened by increasing heights of the active regions, thus reducing or preventing the short channel effect and improving the performance of the semiconductor structure.

In some possible embodiments of the present disclosure, after the step of etching the substrate 10 and the first protective layer 30 to form a plurality of spaced second trenches 12, the second trenches 12 extending along a second direction and not communicating with the air gaps 21 (Step S1041), the first trenches 11 and the second trenches 12 isolate the substrate 10 into a plurality of spaced pillar structures. The pillar structures are doped to form the source regions and the drain regions in the pillar structures. The active regions are formed in the substrate 10 away from the bottoms of the first trenches 11.

In other possible embodiments of the present disclosure, after the step of providing a substrate 10, a plurality of spaced first trenches 11 being formed in the substrate 10, and the first trenches 11 extending along a first direction (Step S101), the substrate 10 between adjacent first trenches 11 is doped to form the active regions, namely the active regions are of a strip shape, and extend along the first direction. After the second trenches 12 are formed, the second trenches 12 cut off the active regions to form a plurality of spaced pillar active regions.

It is to be noted that, referring to FIG. 44 to FIG. 67, after the step of depositing metal on bottoms of the third trenches 51, and carrying out the silicification reaction by annealing to form the BLs 52, the manufacturing method of a semiconductor structure further includes:

Step a: Form first insulating layers in the third trenches, the first insulating layers filling the third trenches.

Referring to FIG. 40 to FIG. 47, the first insulating layers 61 are formed in the third trenches 51 by deposition. The first insulating layers 61 extend along the second direction. The first insulating layers 61 fill up the third trenches 51. For example, the first insulating layers 61 level off the third trenches 51. As shown in FIG. 40 to FIG. 47, the third protective layer 40 on the substrate 10 is removed to expose the substrate 10. Surfaces of the first insulating layers 61 away from the air gaps 21 are flush with the substrate 10, or top surfaces of the first insulating layers 61 are flush with the top surface of the substrate 10. The first insulating layers 61 and the substrate 10 are formed into a regular surface to manufacture other structures conveniently.

The material of the first insulating layers 61 is different from that of the second protective layer 50 and that of the first protective layer 30, so as to remove the second protective layer 50 or the first protective layer 30 individually. Exemplarily, the material of the first insulating layers 61 may be silicon nitride, and the material of the first protective layer 30 and/or the second protective layer 50 may be silicon oxide.

Step b: Remove, along a direction perpendicular to the substrate, the first protective layer and the second protective layer to a preset depth to form filling spaces, the filling spaces exposing side surfaces of the active regions.

Referring to FIG. 48 to FIG. 59, a part of the first protective layer 30 and a part of the second protective layer 50 are removed by etching. The part of the first protective layer 30 and the part of the second protective layer 50 are removed along the direction perpendicular to the substrate 10, to form recesses having a preset depth in the substrate 10. The recesses each include a filling space 72. The filling spaces 72 expose the side surfaces of the active regions. Specifically, the filling spaces 72 expose at least parts of the channel regions.

In some possible embodiments, as shown in FIG. 48 to FIG. 59, the step of removing, along a direction perpendicular to the substrate 10, the first protective layer 30 and the second protective layer 50 to a preset depth to form filling spaces 72, the filling spaces 72 exposing side surfaces of the active regions 13 includes:

Etch the second protective layer 50 and the first protective layer 30 to an initial depth to form filling channels 71. Referring to FIG. 48 to FIG. 51, the first protective layer 30 and the second protective layer 50 are etched along the direction perpendicular to the substrate 10 to form filling channels 71 having an initial depth. The higher one of the source region and the drain region is opposite to the filling channel 71. There are a plurality of filling channels 71, the filling channels 71 are isolated by the first insulating layers 61.

After the filling channels 71 are formed, a second insulating layer 62 is deposited in the filling channels 71. The second insulating layer 62 fills up the filling channels 71 between the substrate 10 and the first insulating layers 61. Referring to FIG. 52 to FIG. 55, the second insulating layer 62 is deposited in the filling channels 71, and the second insulating layer 62 fills up the filling channels 71 between the substrate 10 and the first insulating layers 61. Specifically, the second insulating layer 62 is formed on sidewalls of the filling channels 71. The second insulating layer 62 blocks off the filling channels 71 between the active regions and the first insulating layers 61. After the second insulating layer 62 is formed, the filling channels 71 are isolated into a plurality of spaced openings.

After depositing the second insulating layer 62, the remaining first protective layer 30 and the remaining second protective layer 50 are etched to a preset depth to form filling spaces 72. Referring to FIG. 56 to FIG. 59, the first protective layer 30 and the second protective layer 50 are etched continuously to the preset depth through the remaining filling channels 71. A part of the remaining first protective layer 30 and a part of the remaining second protective layer 50 are removed to form the filling spaces 72. The filling spaces 72 are located under the filling channels 71 and communicate with the filling channels 71.

Step c: Form gate structures in the filling spaces, the gate structures extending along the second direction and surrounding the active regions.

Exemplarily, referring to FIG. 60 to FIG. 67, the step of forming gate structures 80 in the filling spaces 72, the gate structures 80 extending along the second direction and surrounding the active regions includes: Form oxide layers 81 on inner surfaces of the filling spaces 72. Referring to FIG. 56 to FIG. 63, the oxide layers 81 are deposited on the inner surfaces of the filling spaces 72. The oxide layers 81 cover exposed outer peripheral surfaces of the active regions, parts of side surfaces of the first insulating layers 61 and a bottom surface of the second insulating layer 62. The oxide layers 81 annularly provided on the outer peripheral surfaces of the active regions are formed into gate oxide layers of vertical transistors. The oxide layers 81 may be silicon oxide layers.

Then, conductive layers 82 are formed in the filling spaces 72 after the oxide layers 81 are formed. The conductive layers 82 are opposite to at least parts of the channel regions. Referring to FIG. 60 to FIG. 63, the conductive layers 82 are deposited in the filling spaces 72 and etched back. The conductive layers 82 fill at least parts of filling spaces 72. The oxide layers 81 and the conductive layers 82 are formed into the gate structures 80. The gate structures 80 extend along the second direction and surround the active regions. The gate structures 80 are formed in the WLs 83, namely the gate structures 80 are constituted as parts of the WLs 83.

It is to be noted that, after the step of forming gate structures 80 in the filling spaces 72, the gate structures 80 extending along the second direction and surrounding the active regions, the manufacturing method of a semiconductor structure further includes: Deposit a third insulating layer 63 on the gate structures 80, the third insulating layer 63 covering the gate structures 80 and filling up the remaining filling channels 71.

Figure 68:
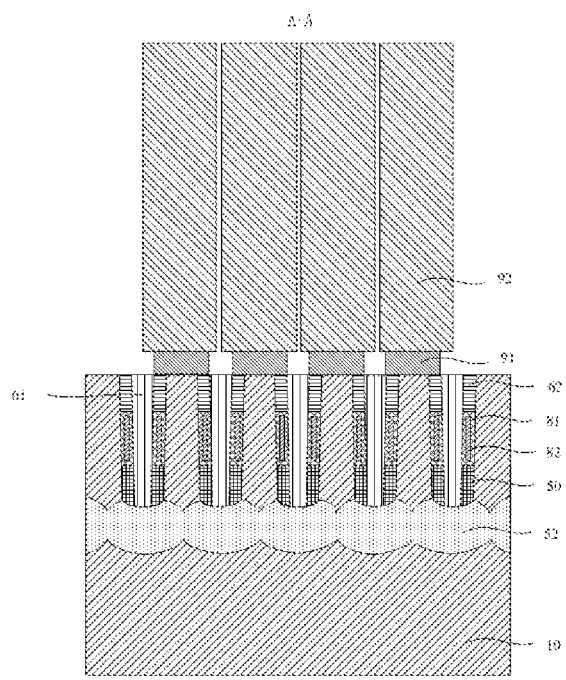
FIG. 68 and FIG. 69 are schematic sectional views at A-A and C-C after capacitors are formed according to an embodiment of the present disclosure.
Figure 69:
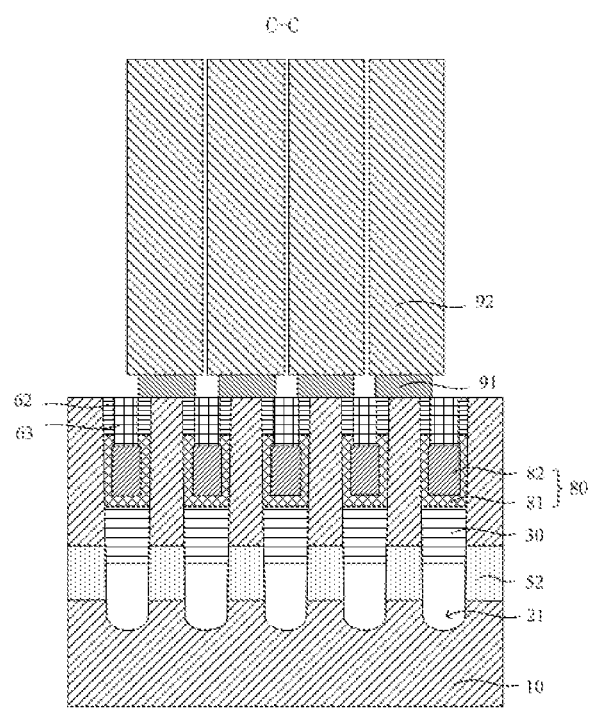

Referring to FIG. 64 to FIG. 67, the third insulating layer 63 is deposited in the remaining filling channels 71. The third insulating layer 63 fills up the filling channels 71. By covering the gate structures 80 with the third insulating layer 63, the gate structures 80 are insulated. The third insulating layer 63, the second insulating layer 62 and the first insulating layers 61 may be made of a same material to form into a whole, thus implementing electrical isolation for the gate structures 80. Referring to FIG. 68 and FIG. 69, after the third insulating layer 63 is formed, contact nodes 91 and capacitors 92 are formed on the substrate 10. The vertical transistors are electrically connected to the capacitors 92 through the contact nodes 91.

Referring to FIG. 2, and FIG. 64 to FIG. 67, an embodiment of the present disclosure further provides a semiconductor structure, including a substrate 10. The substrate 10 may be a silicon-containing substrate, such as a silicon substrate, a silicon-germanium substrate or an SOI substrate. A plurality of spaced BLs 52 are formed in the substrate 10. The BLs 52 extend along a first direction. First trenches are formed between adjacent two of the BLs 52, namely the first trenches also extend along the first direction. As shown in FIG. 2, the first direction is the Y direction. A material of the BLs 52 includes metal silicide, such as cobalt silicide, tungsten silicide, titanium silicide, platinum silicide or nickel silicide, to reduce resistances of the BLs 52.

The BLs 52 each are provided thereon with at least an active region 13. The active region 13 includes a source region, a channel region and a drain region that are stacked sequentially, namely the source region, the channel region and the drain region are arranged vertically. One of the source region and the drain region is electrically connected to the BL 52. For example, the source region is located on the channel region, the drain region is located under the channel region, and the drain region is electrically connected to the BL 52.

Figure 66:
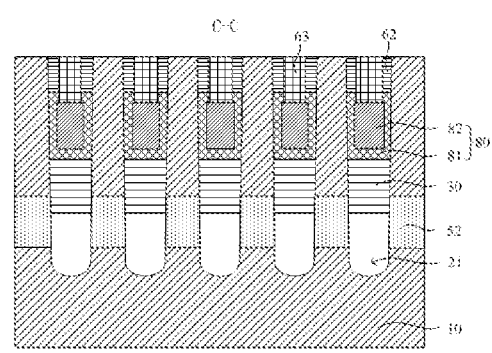
Figure 67:
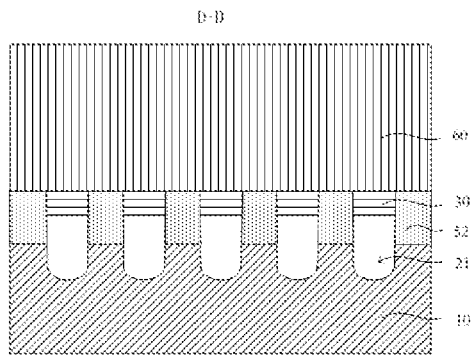

A protective layer (including a first protective layer 30 and a second protective layer 50) is provided in the first trenches. Air gaps 21 are formed between the protective layer and bottoms of the first trenches. Parts of side surfaces of the BLs 52 are exposed in the air gaps 21. As shown in FIG. 66, lower parts of the side surfaces of the BLs 52 are exposed in the air gaps 21, while upper parts of the side surfaces of the BLs 52 contact the protective layer.

The protective layer is further filled between adjacent ones of the active regions. As shown in FIG. 66, a top surface of the protective layer is higher than top surfaces of the BLs 52. The top surface refers to a surface away from the bottom of the first trench. A plurality of spaced first insulating layers 61 are arranged on the protective layer. The first insulating layers 61 extend along a second direction (X direction in FIG. 2). The active regions 13 in the second direction are formed into rows. The first insulating layers 61 are arranged between adjacent two rows of the active regions 13, and spaced apart from the active regions 13. The first insulating layers 61 isolate adjacent two rows of the active regions 13, such that one row of the active regions 13 along the second direction is connected to one of gate structures 80.

The gate structures 80 are provided between the first insulating layers 61 and the active regions 13. The gate structures 80 extend along the second direction, and surround the active regions 13. The gate structures 80 correspond to at least parts of the channel regions. The gate structures 80 each include an oxide layer and a conductive layer 82. The oxide layer covers an outer surface of the conductive layer 82. As shown in FIG. 66, the oxide layer 81 covers a side surface, a bottom surface and a part of a top surface of the conductive layer 82.

A second insulating layer 62 and a third insulating layer 63 further cover the gate structures 80. As shown in FIG. 66, the second insulating layer 62 is opposite to edge regions of the gate structures 80, and the third insulating layer 63 is opposite to middle regions of the gate structures 80. The second insulating layer 62 and the third insulating layer 63 are formed into a whole layer to cover the gate structures 80. The first insulating layers 61, the second insulating layer 62 and the third insulating layer 63 may be made of a same material such as silicon nitride, such that they are formed into a whole to implement electrical insulation on the gate structures 80.

Referring to FIG. 68 and FIG. 69, a contact node 91 is further provided on each of the active regions 13. A capacitor 92 is provided on the contact node 91. The capacitor 92 is electrically connected to the active region 13 through the contact node 91. One of the source region and the drain region contacts the contact node 91, for example, the source region contacts the contact node. The contact node 91 may be polycrystalline silicon. The capacitor 92 is configured to store data information.

According to the semiconductor structure provided by the embodiment of the present disclosure, the BLs 52 extend along the first direction, the first trenches 11 are formed between adjacent two of the BLs 52, the protective layer is provided in the first trenches 11, the air gaps 21 are formed between the protective layer and the bottoms of the first trenches 11, and parts of the side surfaces of the BLs 52 are exposed in the air gaps 21. As the air has a dielectric constant of about 1, the dielectric constant of the structure between the BLs 52 is reduced, thus reducing the parasitic capacitance 92 of the semiconductor structure and improving the working efficiency of the semiconductor structure.

The embodiments or implementations of this specification are described in a progressive manner, and each embodiment focuses on differences from other embodiments. The same or similar parts between the embodiments may refer to each other. In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same embodiment or example. Moreover, the described specific feature, structure, material or characteristic may be combined in an appropriate manner in any one or more embodiments or examples. Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

The invention claimed is:

1. A manufacturing method of a semiconductor structure, comprising:
   providing a substrate, a plurality of spaced first trenches being formed in the substrate, and the first trenches extending along a first direction;
   forming a sacrificial layer in the first trenches and a first protective layer on the sacrificial layer, the sacrificial layer and the first protective layer filling up the first trenches, and the first protective layer in the first trenches being provided with etching holes penetrating through the first protective layer;
   removing the sacrificial layer with the etching holes to form air gaps; and
   carrying out a silicification reaction on the substrate between adjacent ones of the first trenches and close to bottoms of the first trenches, so as to form, in the substrate, bit lines (BLs) extending along the first direction, parts of side surfaces of the BLs being exposed in the air gaps;
   wherein the carrying out a silicification reaction on the substrate between adjacent ones of the first trenches and close to bottoms of the first trenches, so as to form, in the substrate, BLs extending along the first direction, parts of side surfaces of the BLs being exposed in the air gaps comprises:
      etching the substrate and the first protective layer to form a plurality of spaced second trenches, the second trenches extending along a second direction and not communicating with the air gaps;
      forming a second protective layer on sidewalls of the second trenches, the second protective layer in the second trenches enclosing third trenches; and
      depositing metal on bottoms of the third trenches, and carrying out the silicification reaction by annealing to form the BLs;
   wherein before the forming a second protective layer on sidewalls of the second trenches, the second protective layer in the second trenches enclosing third trenches, the manufacturing method further comprises:
      forming active regions in the substrate away from the bottoms of the first trenches, wherein the active regions each comprise a source region, a drain region and a channel region; and the source region, the channel region and the drain region are arranged sequentially along a direction perpendicular to the bottoms of the first trenches;

wherein after the depositing metal on bottoms of the third trenches, and carrying out the silicification reaction by annealing to form the BLs, the manufacturing method further comprises:

forming first insulating layers in the third trenches, the first insulating layers filling the third trenches;

removing, along a direction perpendicular to the substrate, the first protective layer and the second protective layer to a preset depth to form filling spaces, the filling spaces exposing side surfaces of the active regions; and forming gate structures in the filling spaces, the gate structures extending along the second direction and surrounding the active regions; and wherein the removing, along a direction perpendicular to the substrate, the first protective layer and the second protective layer to a preset depth to form filling spaces, the filling spaces exposing side surfaces of the active regions comprises:

etching the second protective layer and the first protective layer to an initial depth to form filling channels;

depositing a second insulating layer in the filling channels, the second insulating layer filling up the filling channels between the substrate and the first insulating layers; and etching the remaining first protective layer and the remaining second protective layer to the preset depth to form the filling spaces.

2. The manufacturing method of a semiconductor structure according to claim 1, wherein the forming a sacrificial layer in the first trenches and a first protective layer on the sacrificial layer, the sacrificial layer and the first protective layer filling up the first trenches, and the first protective layer in the first trenches being provided with etching holes penetrating through the first protective layer comprises:

depositing the sacrificial layer in the first trenches, the sacrificial layer filling the bottoms of the first trenches;

depositing the first protective layer on the sacrificial layer, the first protective layer leveling off the first trenches; and etching the first protective layer at edges of the first trenches to form the etching holes.

3. The manufacturing method of a semiconductor structure according to claim 2, wherein the depositing the first protective layer on the sacrificial layer, the first protective layer leveling off the first trenches comprises:

depositing the first protective layer on the sacrificial layer and the substrate, the first protective layer filling the first trenches and covering a top surface of the substrate; and removing the first protective layer on the top surface of the substrate to expose the substrate.

4. The manufacturing method of a semiconductor structure according to claim 1, wherein the etching holes extend to the sacrificial layer.

5. The manufacturing method of a semiconductor structure according to claim 1, wherein a material of the BLs comprises metal silicide.

6. The manufacturing method of a semiconductor structure according to claim 1, before the etching the substrate and the first protective layer to form a plurality of spaced second trenches, the second trenches extending along a second direction and not communicating with the air gaps, the manufacturing method further comprises:

depositing a third protective layer on the substrate and the first protective layer; and the etching the substrate and the first protective layer to form a plurality of spaced second trenches comprises: etching the substrate, the first protective layer and the third protective layer to form the plurality of spaced second trenches, and remaining the third protective layer between adjacent ones of the second trenches.

7. The manufacturing method of a semiconductor structure according to claim 6, wherein the first protective layer, the second protective layer and the third protective layer are made of a same material.

8. The manufacturing method of a semiconductor structure according to claim 1, wherein the first protective layer and the first insulating layers are made of different materials.

9. The manufacturing method of a semiconductor structure according to claim 1, wherein the forming gate structures in the filling spaces, the gate structures extending along the second direction and surrounding the active regions comprises:

forming oxide layers on inner surfaces of the filling spaces; and forming conductive layers in the filling spaces after the oxide layers are formed, the conductive layers being opposite to at least parts of the channel regions.

10. The manufacturing method of a semiconductor structure according to claim 1, after the forming gate structures in the filling spaces, the gate structures extending along the second direction and surrounding the active regions, the manufacturing method further comprises:

depositing a third insulating layer on the gate structures, the third insulating layer covering the gate structures and filling up the remaining filling channels.

11. The manufacturing method of a semiconductor structure according to claim 10, wherein the first insulating layers, the second insulating layer and the third insulating layer are made of a same material.

* * * * *